United States Patent [19]
Jiang et al.

[11] Patent Number: 5,101,109
[45] Date of Patent: Mar. 31, 1992

[54] PERSISTENT PHOTOCONDUCTIVITY QUENCHING EFFECT CRYSTALS AND ELECTRICAL APPARATUS USING SAME

[75] Inventors: Hongxing Jiang; Jingyu Lin, both of Manhattan, Kans.

[73] Assignee: Kansas State University Research Foundation, Manhattan, Kans.

[21] Appl. No.: 597,021

[22] Filed: Oct. 15, 1990

[51] Int. Cl.$^5$ .................................. H01L 31/0296
[52] U.S. Cl. .................. 250/338.4; 357/61; 357/30
[58] Field of Search .............. 357/61, 30; 430/51, 430/56, 84, 86, 87, 94; 307/311; 250/338.4

[56] References Cited

U.S. PATENT DOCUMENTS

| | | | |
|---|---|---|---|
| 3,218,203 | 11/1965 | Ruehrwein | 357/61 |
| 3,309,553 | 3/1967 | Kroemer | 357/61 |
| 3,390,090 | 6/1968 | Taylor et al. | 357/30 B |
| 3,716,406 | 2/1973 | Scholl et al. | 357/30 B |
| 3,918,971 | 11/1975 | Zweig | 430/51 |

*Primary Examiner*—William D. Larkins
*Attorney, Agent, or Firm*—Hovey, Williams, Timmons & Collins

[57] ABSTRACT

Mixed II-VI crystal semiconductors (10) having the general formula $Zn_xCd_{1-x}Se$, where x is up to about 0.4, are provided which exhibit persistent photoconductivity (PPC) above 70° K. which is quencable by infrared radiation. An electrical apparatus (12) utilizing the crystal (10) of the invention is further provided. The apparatus (12) preferably includes a pair of electrical terminals (14, 16) coupled to the crystal (10), circuit-defining structure (18) connecting the terminal (14, 16) coupled with a power source (19) and a current responsive device (20) being in series with the crystal (10). Action of visible light on the crystal (10) induces PPC, completing an electrical circuit and initiating current flow. Incident infrared light on the crystal (10) quenches PPC and decreases current flow.

9 Claims, 3 Drawing Sheets

PERSISTENT PHOTOCONDUCTIVITY QUENCHING EFFECT CRYSTALS AND ELECTRICAL APPARATUS USING SAME

BACKGROUND OF THE INVENTION

1. Field of the Invention

The present invention is broadly concerned with crystalline bodies having atoms of Groups II and VI therein which exhibit persistent photoconductivity (PPC), a phenomenon of photo-induced conductivity that persists for a very long period of time after the removal of an exciting light source. More particularly, it is concerned with II-VI mixed crystals having the general formula $Zn_xCd_{1-x}Se$, where x is up to about 0.4, and with complete electrical apparatus (e.g., sensors and detectors) using the PPC crystals of the invention.

2. Description of the Prior Art

One of the most interesting and important phenomena under intensive investigation in the field of semiconductor materials is the slow relaxation of photoexcited carriers, manifested as persistent photoconductivity (PPC). The PPC effect has been observed in a great variety of materials. Prior PPC materials demonstrate PPC relaxation times which generally decrease with increasing temperature. Several mechanisms have proposed to explain the effect. One such mechanism is the so-called macroscopic barrier model, which predicts a PPC decay essentially logarithmic in time for artificially constructed layered materials. This prediction is consistent with experimental observations. However, PPC in bulk semiconductors is not yet well understood, and usually cannot be described by this model.

Another proposed mechanism is the DX center model, which involves photoexcitation of electrons from deep level traps which undergo a large lattice relaxation. According to this model, PPC is induced because recapture of electrons by DX centers is prevented by a thermal barrier at low temperatures. This model explains many PPC features as well as the large Stokes shift observed in $Al_xGa_{1-x}As$ materials. The nature of the DX centers is still being investigated intensively.

These two models predict the existence of PPC at low temperatures. Previously reported results of experimental investigations of most semiconductor materials have shown PPC effect predominantly at low temperatures. Neither the macroscopic barrier nor the DX center models account for PPC which may be observable above 150° K. and still exists up to room temperatures.

Previous III-V mixed crystal semiconductors, that is, semiconductor crystals formed of elements from groups III and V of the Periodic Table, exhibit PPC at low temperatures. However, PPC in these crystals cannot be quenched by infrared radiation.

SUMMARY OF THE INVENTION

The present invention is concerned with new PPC crystals which exhibit PPC at temperatures in excess of 70° K., making PPC effects possible at room temperatures. While the inventors do not wish to be bound to any theory of operation, experimental results suggest that the high temperature PPC effects observed with the crystals of the invention are caused by random local potential fluctuations induced by composition fluctuations in the crystals. The energy gap therefore can be easily controlled over a wide range by varying the composition of the crystals.

The single crystals of the present invention preferably include zinc, cadmium and selenium in the formula $Zn_xCd_{1-x}Se$, forming hexagonal crystals which are capable of operating at room temperature. In the above formula, x is up to about 0.4, and more preferably from about 0 to 0.4 and most preferably from about 0.01 to 0.4. The crystals exhibit two PPC states—a first state in which PPC decays more rapidly as temperature decreases, and a second in which PPC decays more rapidly as temperature increases. In particularly preferred forms, crystals of the formula $Zn_{0.3}Cd_{0.7}Se$ are used, these being prepared from purified ZnSe and CdSe powders.

The invention also comprehends electrical apparatus making use of the novel PPC crystals. Such devices include for example infrared detectors, photon dose meters, and photon wavemeters.

In particularly preferred forms, the apparatus of the invention includes an infrared detector of mixed II-VI crystals as described above, and further comprises a pair of electrical terminals coupled with the crystal along with circuit means connected with the terminals in order to place the crystal in an electrical circuit together with a power source and a current-responsive operating device. Once PPC is induced in the detector by visible illumination, the conductivity reaches a saturation level, and is quenched to a lower saturation level by absorption of infrared light.

DESCRIPTION OF THE PREFERRED EMBODIMENT

Figure 1:
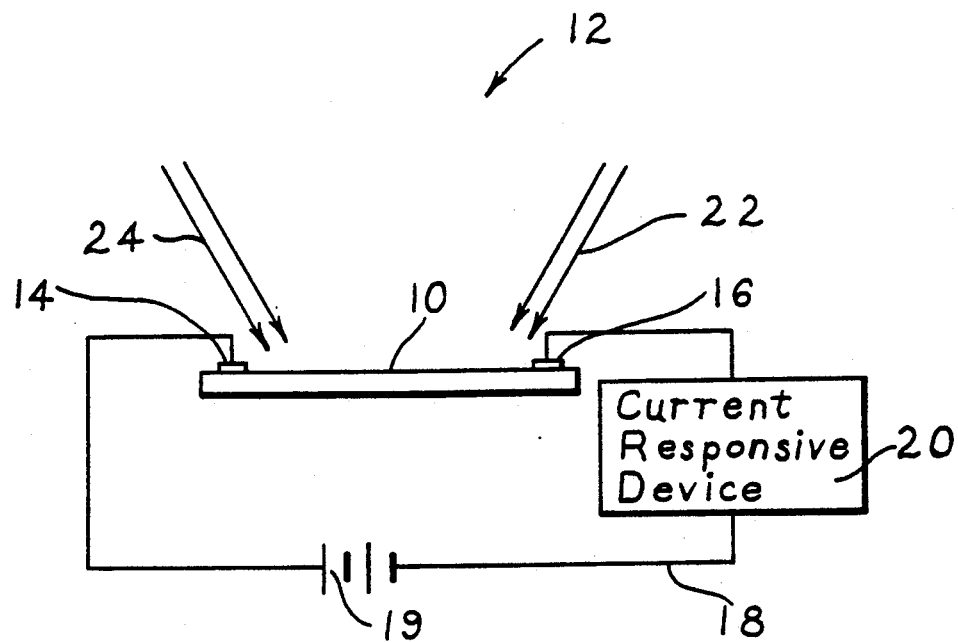
FIG. 1 is a schematic representation of an electrical device making use of a PPC crystal of the invention.

Referring now to the drawings, a representative electrical apparatus in accordance with the present invention is illustrated in FIG. 1. A crystal 10 ($Zn_{0.3}Cd_{0.7}Se$ having preferred dimensions of 1 cm length and width, ½ mm thickness and a dark room resistivity of about $10^9$ ohm-cm) in accordance with the invention is shown as a part of an infrared detector 12. Those skilled in the art will appreciate that the crystals of the invention may be used in connection with any number of other electrical apparatus where PPC characteristics are desired, such as infrared wavemeters. In any event, electrical terminals 14, 16 are connected to crystal 10 at spaced locations as shown. The terminals 14, 16 are in turn connected in series via wire 18 with a power source (here battery 19) and a current-responsive device 20, particularly an ammeter for detecting current flow.

Crystal 10 preferably is of the formula $Zn_{0.3}Cd_{0.7}Se$, although any II-VI crystal having the general formula $Zn_xCd_{1-x}Se$ where x is up to 0.4, may be utilized, so long as it exhibits the desired degree of PPC activity.

Figure 2:
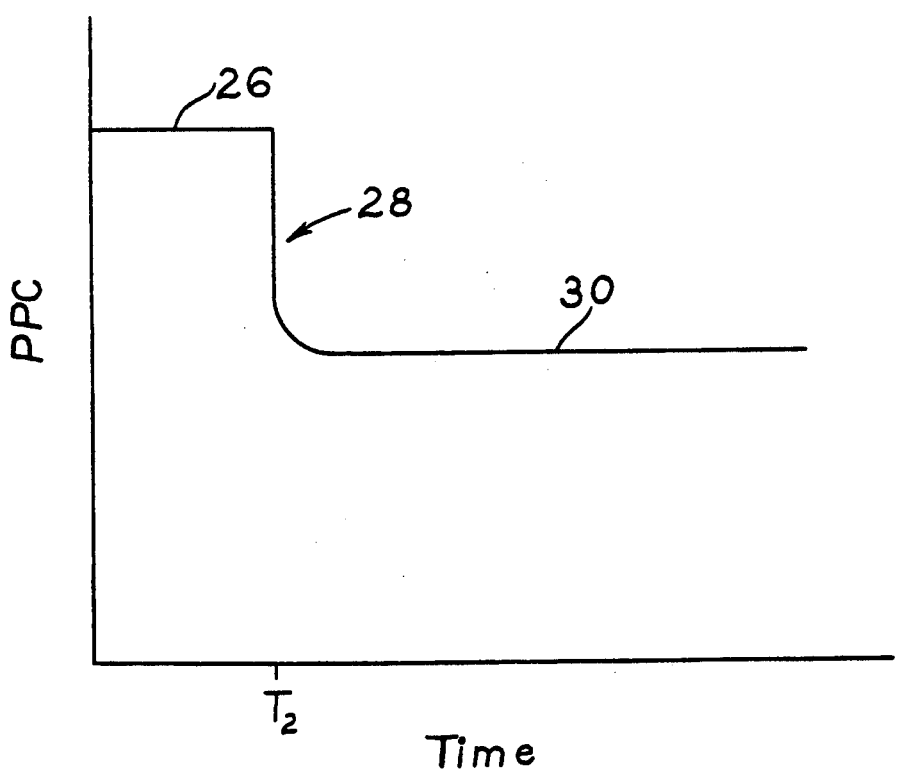
FIG. 2 is a plot of experimentally observed electrical characteristics at room temperature using an infrared detector in accordance with the invention.

In the use of detector 12, a source of visible light 22 induces PPC in semiconductor crystal 10, thus completing the circuit as indicated by ammeter 20. The latter indicates current flow as indicated in FIG. 2. Upon absorption of infrared light 24 by crystal 10, PPC activity is quenched, and the magnitude of current through the described electrical circuit diminishes to an extent measured by ammeter 20.

Observed room temperature electrical characteristics of detector 12 is shown in FIG. 2. Visible light 22 causes PPC to saturate to level 26. Subsequent absorption of broad band infrared light 24 at time $T_2$ causes a sharp decline 28 in conductibility to a reduced, quenched level 30.

Preferably, crystals in accordance with the invention are grown from solid solution using purified ZnSe and CdSe powders in appropriate weight proportions as starting materials. In constructing electrical apparatus using the crystals, gold leads are attached to a crystal body using indium solder, with the junctions being carefully tested for ohmic contacts.

In testing the PPC crystals hereof, each sample was attached to a copper sample holder in a manner to ensure good thermal contact, with electrical isolation. A photon dose of about $2 \times 10^{13}$ photons/cm$^2$ per second was delivered to the mounted sample using a mercury lamp as the excitation light source. Appropriate filters were used so that two lines at 435.8 nm and 546.1 nm dominated the output spectrum of the excitation light.

Measurements of PPC below room temperatures were performed in a closed-cycle refrigerator wherein the system was cooled in darkness to a desired temperature. Once the PPC measurement was taken, the system was warmed to room temperature and allowed to relax the equilibrium. This procedure was repeated for each temperature thus ensuring identical initial conditions of measurement.

Figure 3:
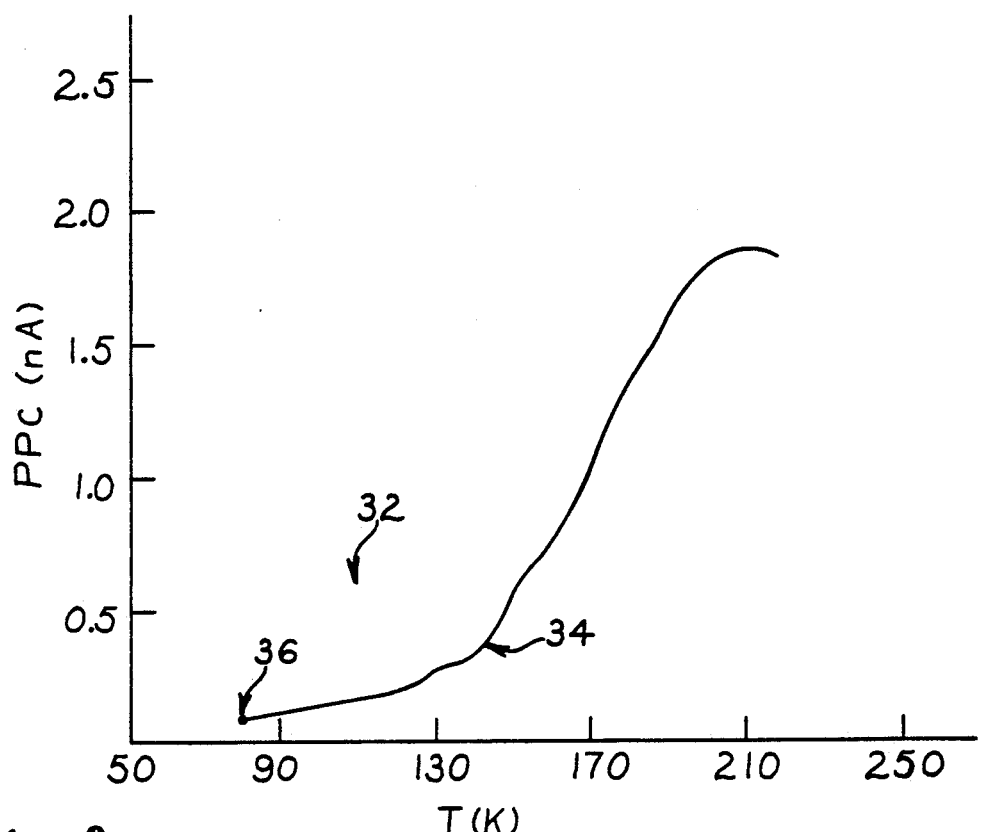
FIG. 3 is a graph of the buildup levels of PPC in the crystal of the invention as a function of temperature.

As shown in FIG. 3, PPC in the crystal $Zn_{0.3}Cd_{0.7}Se$ increased slowly in the temperature region 32 of 70° K. to 120° K., and then increased sharply in temperature region 34 near 120° K. As the temperature was lowered below point 36 at 70° K., virtually no PPC (or even conventional photoconductivity) was observed.

Figure 4:
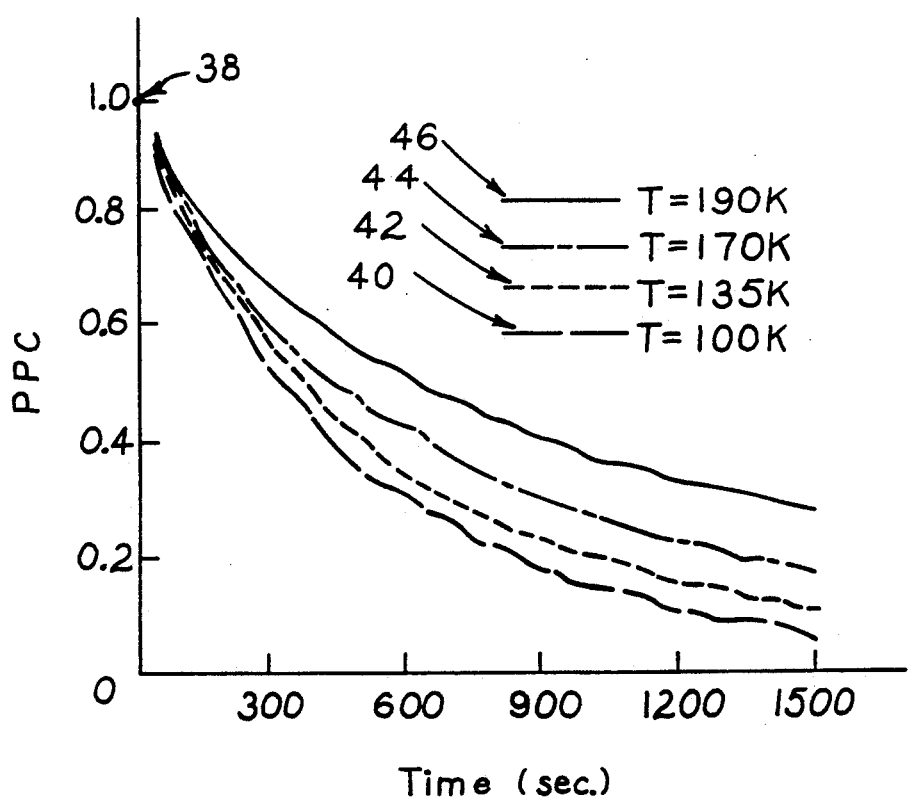
FIG. 4 is a graph showing PPC decay curves for a PPC crystal at four selected temperatures.

FIG. 4 shows PPC decay in the same crystal over time at four different temperatures, with each curve normalized to unity at point 38 where time=0. Curve 40 represents a temperature of 100° K., curve 42 represents 135° K., curve 44 represents 170° K., and curve 46 represents 190° K. The slopes of the respective curves demonstrate that contrary to expected decay behavior, PPC in the crystals of the invention decays faster as temperature decreases. However, when temperature increases to above 220° K., PPC decays more rapidly as temperature increases. Despite the increased decay rate, useful PPC continues to exist in the crystal at room temperature.

Figure 5:
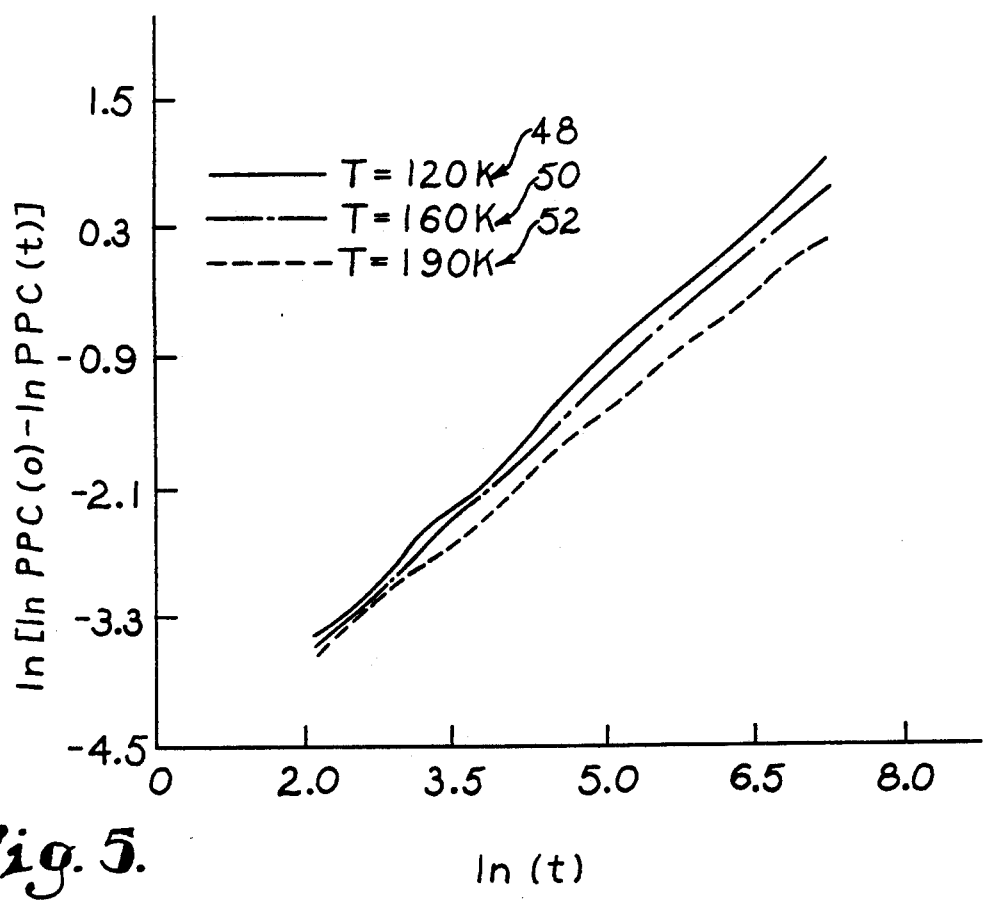
FIG. 5 is a plot of $\ln[\ln PPC(0) - \ln PPC(t)]$ versus $\ln(t)$ for a PPC crystal at three selected temperatures.

FIG. 5 illustrates representative plot of the equation $\ln[\ln PPC(0) - \ln PPC(t)]$ vs. $\ln(t)$ in the crystal $Zn_{0.3}Cd_{0.7}Se$ at three temperatures. Curve 48 represents 120K., curve 50 represents 160° K., and curve 52 represents 190° K. The perfect linear behavior of the plots demonstrates that the PPC decay is well described by the stretched-exponential function $PPC(t) = PPC(0)\exp[-t/\tau)^\beta]$, where beta and tau are two decay parameters, with beta and tau for different temperatures determined from least square fit with empirical data. A stretch-exponential relaxation evolution reveals similarities of the present crystal systems to the disordered systems, and thus implies that microscopic random potential fluctuations are the origin of the observed PPC phenomena.

Figure 6:
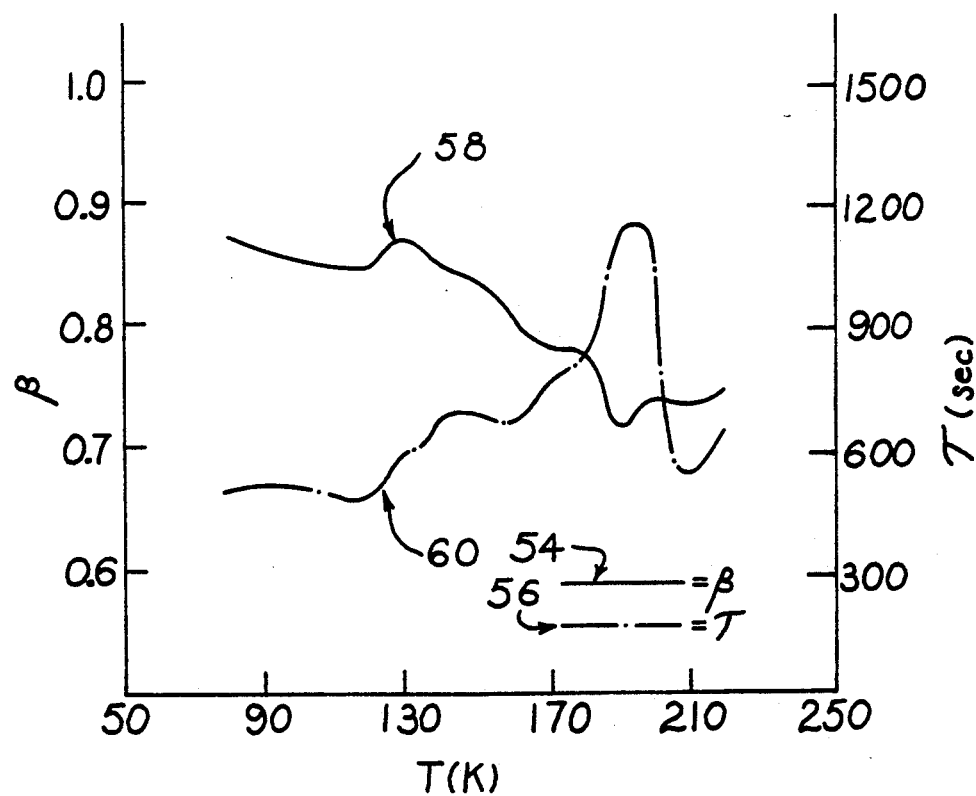
FIG. 6 is a plot of the decay parameters beta and tau versus temperature for a PPC crystal in accordance with the invention.

FIG. 6 illustrates beta and tau as functions of temperature in curves 54 and 56 respectively. The value of beta is about 0.85±0.03 below 120° K., and clearly decreases at point 58 near 120° K. The characteristic decay time constant, tau, also shows a phase transition at point 60 near 120° K. At temperatures above 220° K., the decay of PPC is no longer well described by the stretched-exponential model. The PPC relaxation rate increases as temperature increases in the region of T greater than 220° K.

The following example describes the preferred procedures for preparation of a representative crystal of the present invention.

EXAMPLE I $Zn_{0.2}Cd_{0.8}Se$ II-VI mixed crystals were grown from the vapor phase in a closed moving crucible which permitted an efficient utilization of the change and flexibility in the dimensions of the crystal. The crucible was made from standard clear quartz tubing and was placed inside a gas-tight mullite tube. The outer tube of the crucible was sealed with a blunt conical tip. The mullite tube was closed at one end and sealed at the other end with a tapered glass joint to permit evacuation of the tube or injection of slow flow of an inert gas at atmospheric pressure.

A $Zn_{0.2}Cd_{0.8}Se$ charge was sintered by packing 20 g of purified ZnSe powder of 80 g of purified CdSe powder into a quartz tube and vacuum baked at 900° C.-1000° C. for approximately 10 hours. The baked charge of $Zn_{0.2}Cd_{0.8}Se$ was then placed in the crucible and baked with a closed quartz tube fitting snugly into the crucible. The mullite tube containing the quartz crucible was evacuated ($10^{-5}$ Torr) and slowly heated to 500° C. in a zone furnace. After one hour of baking to remove volatile impurities, a slow stream of argon at 1 atmospheric pressure was injected and allowed to escape by bubbling through a bottle containing dibutylphthalate. The furnace temperature was increased to about 1150° C. while maintaining the argon stream at 1 atmosphere, for about 24 hours. The entire mullite tube was then pushed so that the tip of the crucible was moved into the cooler zone in a temperature gradient of 20° c/cm at a rate of 1 mm/hour. As the tube moved, the supersaturation at the tip increased until nucleation occurred. A single crystal having a hexagonal structure grew out from the tip at a rate of approximately 1 mm/hour.

The crystals of the invention have a number of advantageous features. Principal among these are the presence of significant PPC effects at relatively high temperatures of about 70° K. and stretched-exponential decay at temperature T of 70° K.<T<220° K. Moreover, PPC in the crystals exhibits fast infrared radiation quenching response times on the order of $10^{-9}$ seconds, with high sensitivity and low electrical noise characteristics.

We claim:
1. An electrical apparatus comprising:
    a crystalline body having the general formula $Zn_xCd_{1-x}Se$ where x ranges from about 0.1 to 0.4, said body exhibiting persistent photoconductivity both during and after exposure to an exciting light source;

a pair of electrical terminals operatively coupled with said body, a source of exciting light adapted to be applied to said body, causing said body to be photoconductive;

at least one conductor for connecting said terminals with a source of electrical power, and for placing said body within an electrical circuit, including structure for imposing a voltage on said terminals and thereby on said body for inducing a first current flow level through said circuit and said body which is related to the application of said exciting light source;

a source of infrared light adapted to be applied to said body for altering the photoconductivity of said body to a second current flow level; and a current responsive device operably coupled in said circuit for determining a change from said first current flow level to said second current flow level.

2. The apparatus of claim 1, wherein x is about 0.3.

3. The apparatus of claim 1, wherein x is about 0.2.

4. The apparatus of claim 1, wherein said apparatus comprises an ammeter.

5. A method of detecting light, comprising the steps of:

providing a crystalline body having the general formula $Zn_xCd_{1-x}Se$ where x ranges from about 0.1 to 0.4, said body exhibiting persistent photoconductivity both during and after exposure to an exciting light source, the photoconductivity of said crystalline body rising to a first level upon exposure to said exciting light source, and being quenchable to a second, lower level upon exposure thereof to an infrared light source, said levels corresponding to respective first and second current flow levels through said body;

exposing said crystalline body to said exciting light source;

imposing a voltage across said crystalline body during and after said exposure to said exciting light source for inducing current flow therethrough;

exposing said crystalline body to a infrared light source for reducing said current flow to said second current flow level; and determining a change from said first current flow level to said second current flow level.

6. The method of claim 5, wherein x is about 0.3.

7. The method of claim 5, wherein x is about 0.3.

8. The method of claim 5, wherein said determining step comprises the steps of measuring said first and said current flow levels and determining the difference therebetween.

9. The method of claim 5, said step of exposing said body to said exciting light source comprising the steps of exposing the body to visible light.

* * * * *